United States Patent [19]

Hoover, Jr. et al.

[11] Patent Number: 4,507,661

[45] Date of Patent: Mar. 26, 1985

[54] INTERFERING NOISE PULSE ELIMINATOR AND ITS USE IN A DICKE TYPE RADIOMETER CIRCUIT

[75] Inventors: Mervyn C. Hoover, Jr.; Bruce M. Heydlauff, both of Ridgecrest, Calif.

[73] Assignee: The United States of America as represented by the Secretary of the Navy, Washington, D.C.

[21] Appl. No.: 371,706

[22] Filed: Apr. 26, 1982

[51] Int. Cl.³ .................... G01S 13/86; H04B 1/10
[52] U.S. Cl. ...................... 343/351; 455/224
[58] Field of Search ............ 455/223, 224; 358/167; 375/104; 343/351, 17.1 R

[56] References Cited

U.S. PATENT DOCUMENTS

| | | | |
|---|---|---|---|
| 2,860,333 | 11/1958 | Flowers et al. | 343/17.1 |
| 2,868,970 | 1/1959 | Aitken | 250/27 |
| 2,936,451 | 5/1960 | Miller | 343/17.1 |
| 3,140,443 | 7/1964 | Wimberly | 325/335 |
| 3,339,144 | 8/1967 | Squires | 455/224 |
| 3,599,207 | 8/1971 | Foiani et al. | 343/5 R |
| 3,621,401 | 11/1971 | Young, Jr. et al. | 358/167 X |
| 3,939,425 | 2/1976 | Toyoshima | 455/222 |
| 3,953,802 | 4/1976 | Morris et al. | 375/104 X |
| 4,246,441 | 1/1981 | Sugai et al. | 455/223 X |

Primary Examiner—Theodore M. Blum
Assistant Examiner—Gilberto Barrón, Jr.
Attorney, Agent, or Firm—Robert F. Beers; W. Thom Skeer

[57] ABSTRACT

An apparatus and method removes interfering noise pulses from low-level radio-frequency signals through the application of a video-frequency circuit which causes detection of interfering pulses above an automatically and dynamically established threshold voltage level. Upon detection of an interfering pulse a control signal activates a hold circuit causing the conventional radiometric circuit to be interrupted during the period of the occurrence of the interfering pulse, thereby blocking passage of the pulse, while simultaneously the voltage level of the video-frequency signal is held constant.

2 Claims, 4 Drawing Figures

SAME LEVEL AS PEAK NOISE VOLTAGE AT 53

FIG.3ℓ

NOTE: TIME PERIODS IN FIG. 3ℓ ARE EXAGGERATED IN ACTUAL OPERATION $t_i \ll t_p/2$.

FIG. 4a.
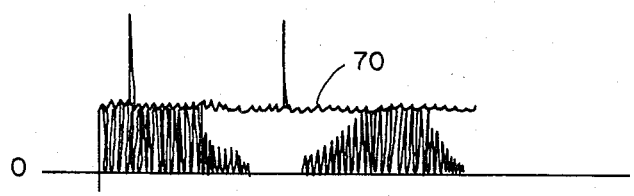
FIG. 4b.
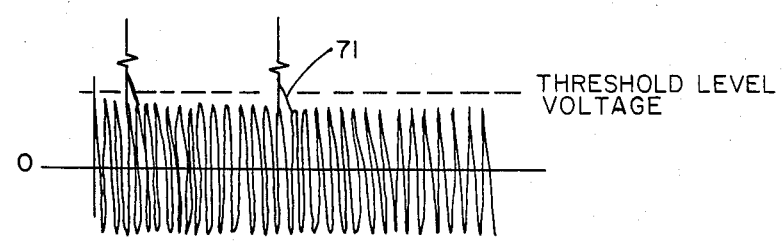
THRESHOLD LEVEL VOLTAGE
FIG. 4c.
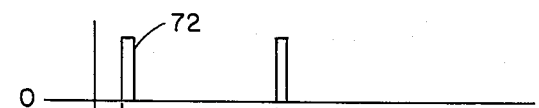
FIG. 4d.
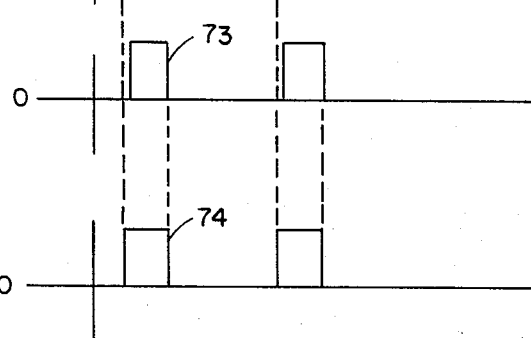
FIG. 4e.
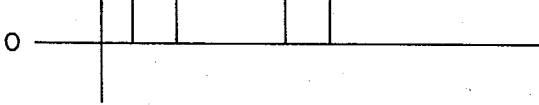
FIG. 4

INTERFERING NOISE PULSE ELIMINATOR AND ITS USE IN A DICKE TYPE RADIOMETER CIRCUIT

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATION

This application relates to U.S. Patent and Trademark Office, Ser. No. 196,225, entitled "A Radar Radiometer and Its Use", filed Oct. 14, 1980 by Mervyn C. Hoover, Jr.

BACKGROUND OF THE INVENTION

1. Field of the Invention

The present invention relates to an apparatus and a method for removing interfering pulses from modulated or unmodulated video frequency signals. More particularly, it automatically and dynamically adjusts its threshold for detection and elimination of interfering noise pulses, e.g. from a neighboring radar transmitter, from a radiometric information signal.

2. Description of the Prior Art

One method for eliminating interfering signals caused by neighboring radar systems from a receiving radar antenna is through use of phase splitter, polarity and amplitude control and amplitude gates to cause the interfering pulses to cancel themselves out of the echo presentation or display device of the receiving system. This method focuses upon accomplishing an elimination of such interference in a qualitative manner and not in the carefully controlled quantitative manner needed for radiometer receiver interference.

Another method employs the heterodyne principal under conditions of strong interference by shifting the frequency of the system receiving the interference so that the signal to be measured is proportional to the weak signal of interest and not the strong interference signal. This method requires the operation of all circuits and elements to be linear regardless of signal amplitude and also requires active adjustment of the frequency of operation of the transmitting-receiving system subject to the interference.

Still another method which is directed to a combined frequency modulated radar and radiometer system uses a reference system including a dual frequency modulated oscillator which functions as both a radar transmitter and as a radar radiometer local oscillator. Such a reference system includes a switch which alternately connects a receiver to a reference termination and to an antenna. The radiometer used in the reference system is generally of the "Dicke" type modified to include a radar capability. Such a system provides for the broad concept of both a radar and a radiometer capability in combination. However, the ability of the reference system to eliminate radio frequency interference is a disadvantage in some applications.

Still another method relates to a frequency-scanning receiving systems' ability to reject clutter or interfering noise signals, e.g. doppler returns, in the process of locating the presence of the desired signal energy. The method utilizes a swept oscillator to detect undesired clutter signals and to establish a means for limiting the swept frequency range to eliminate the clutter signals. In addition to the need for frequency sweeping, the system is limited to CW type operation.

Another known method is directed toward muting AM noise occurring between incoming information carrying signal frequencies as the AM signal frequency is being tuned from one information carrying frequency to another. The method uses a phase lock loop which when locked on a carrier frequency causes the muting device to deactivate. This method is frequency sensitive and is not designated to handle pulses of interfering noise.

SUMMARY OF THE INVENTION

A radiometric receiver subjected to interference pulses from radars or other sources is designed to automatically and dynamically eliminate the interference from the information content of a radiometric signal. As these interfering pulses pass through the video circuit, a wideband amplifier samples them and passes them to a comparator where an automatically established or a preset threshold signal facilitates their detection. A control circuit is actuated thereby to cause a holding circuit to interrupt the video-frequency signal during the period of the interfering pulse while simultaneously holding the video frequency signal voltage constant for this period.

OBJECTS OF THE INVENTION

An object of the present invention is to provide for removal of interference pulses from a video-frequency circuit.

Another object is to automatically detect and remove interference pulses from a video-frequency circuit.

Still another object is to provide a method for automatically removing interference pulses caused by a hostile electromagnetic environment in close proximity to very sensitive, low-level passive detectors of radiation, e.g. radio-frequency radiometric receivers located near operating active radar systems.

These and other objectives will become apparent from the following description of the preferred embodiments, claims and attached drawings.

BRIEF DESCRIPTION OF THE DRAWINGS

FIG. 4 is a waveform diagram of FIG. 2.

DESCRIPTION OF THE PREFERRED EMBODIMENT

Figure 1:
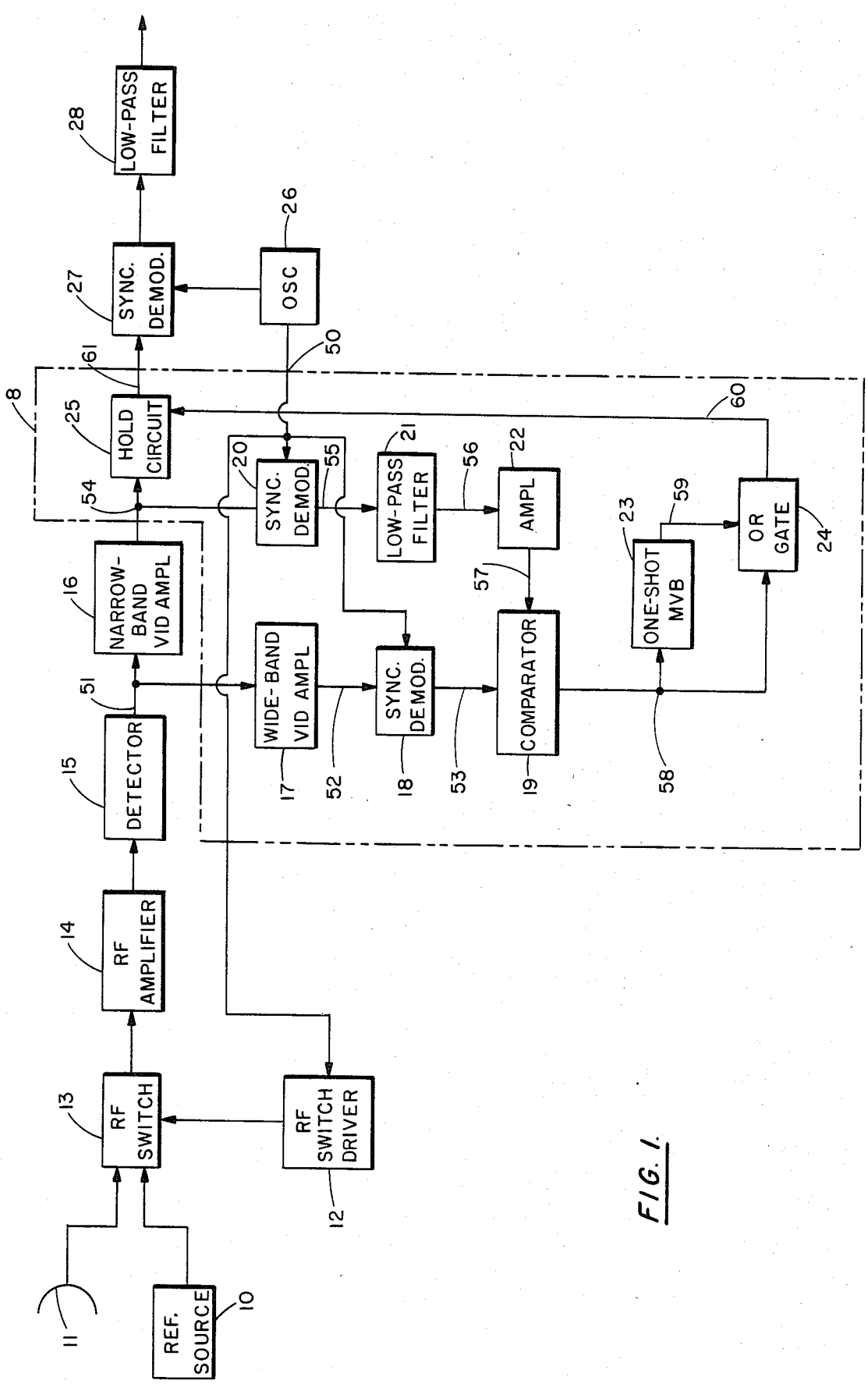
FIG. 1 is a block diagram of an embodiment of the present invention.

FIG. 1 shows a radar system having a standard type of "Dicke" radiometer. This radiometer includes antenna 11, radio-frequency (RF) switch 13, reference source 10, switch driver 12, RF amplifier 14, detector 15, narrowband video amplifier 16, synchronous demodulator 27, oscillator 26, low-pass filter 28 and feed out to an analysis or monitoring circuit. These components comprise the conventional configuration of a radiometeric system useful when unaffected by interfering noise pulses.

For purposes of eliminating interfering noise pulses, FIG. 1 also shows an incorporated embodiment of a noise pulse eliminating circuit 8. This circuit includes a wideband video amplifier 17, synchronous demodulators 18 and 20, low-pass filter 21, general amplifier 22, comparator 19, one-shot multivibrator 23, OR gate 24 and hold circuit 25.

More particularly, radio-frequency energy received by antenna 11 is fed to RF switch 13 which has three input ports from antenna 11, switch driver 12 and a reference source 10. The radio-frequency energy is amplified by RF amplifier 14 and converted to a video-frequency signal by detector 15.

Modulation of RF switch 13 through switch driver 12 is controlled by oscillator 26 which also simultaneously controls synchronous demodulators 18, 20, and 27. While the modulation duty cycle for a normal "Dicke" radiometer is antenna 11 connected one-half time and reference source 10 connected the remaining one-half time of the period, other duty cycles may obviously be established and controlled by the oscillator and the switch driver. A typical voltage waveform of the "Dicke" duty cycle is shown as 50 in FIG. 3a.

Figure 3:
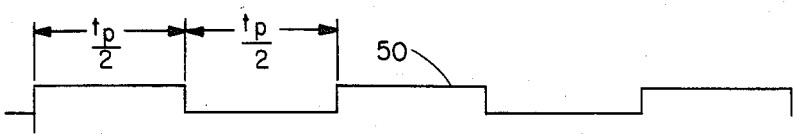
FIG. 3 is a waveform diagram of FIG. 1.
Figure 3:
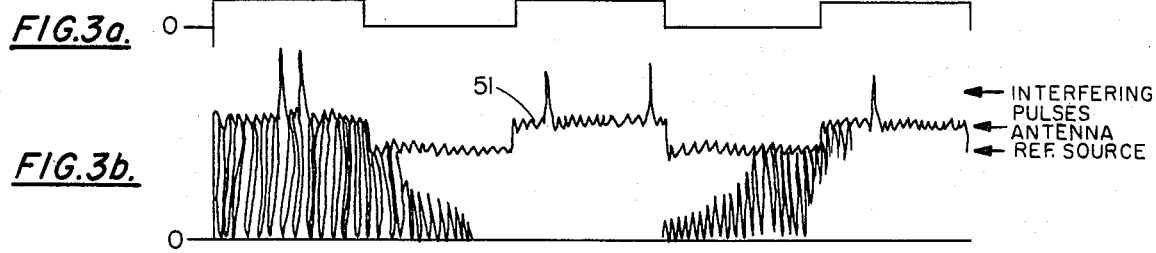
Figure 3:
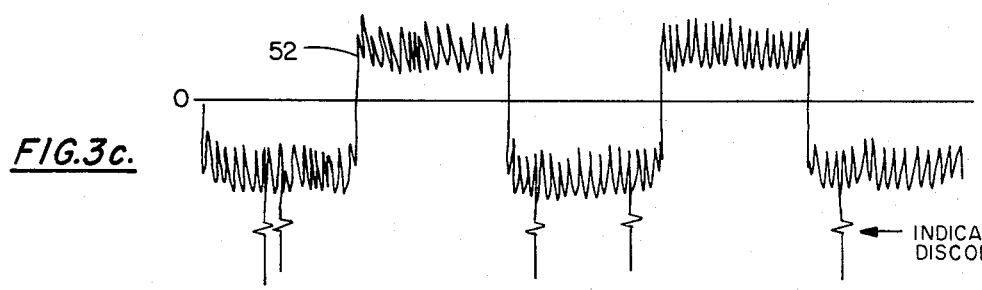
Figure 3:
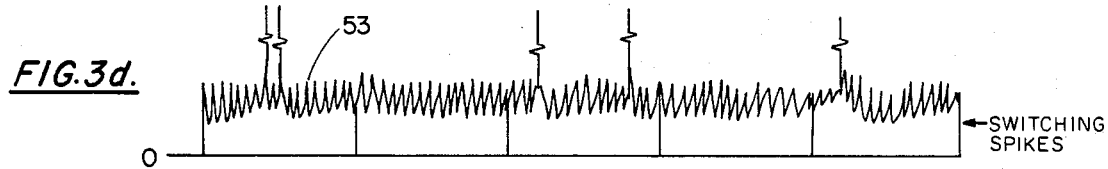
Figure 3:
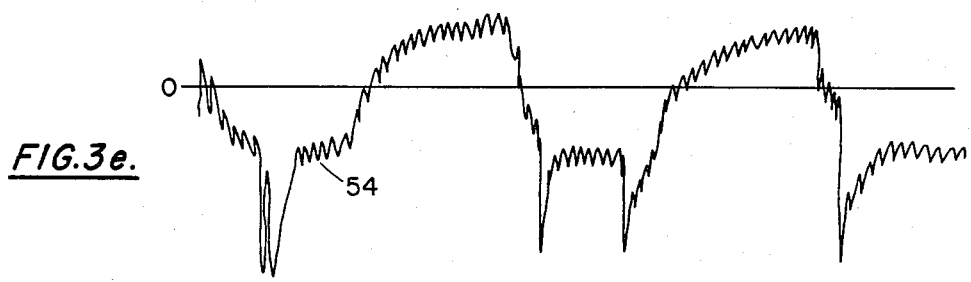
Figure 3:
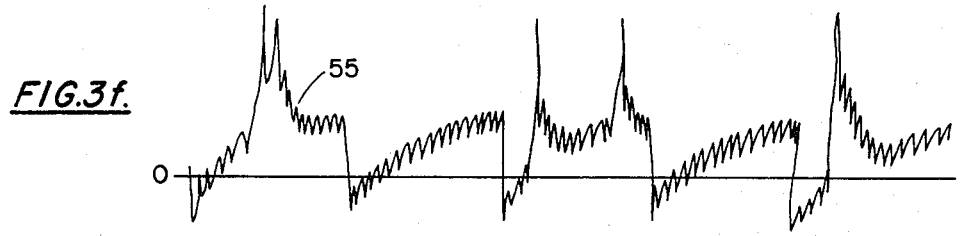

The specific embodiment of the apparatus and method of the present invention originates with the output signal from detector 15. In FIG. 3b, voltage waveform 51 represents a video-frequency signal containing undesired interfering noise pulses generally caused by nearby operations of active radar systems, although, as should be clear, they could be caused by other means. The noise contaminated signal (waveform 51) is fed to wideband video amplifier 17 where amplification is performed over a wide frequency range in a manner that little distortion or attenuation occurs to the interfering pulses. Simultaneously, the contaminated signal passes through narrowband video amplifier 16 which has a bandwidth many orders of magnitude narrower than the wideband video amplifier thereby causing attenuation and some phase shifting of the interfering pulses. Waveforms 52, FIG. 3c, and 54, FIG. 3e, reflect the voltage signal following wideband and narrowband amplification, respectively.

Figure 3G:
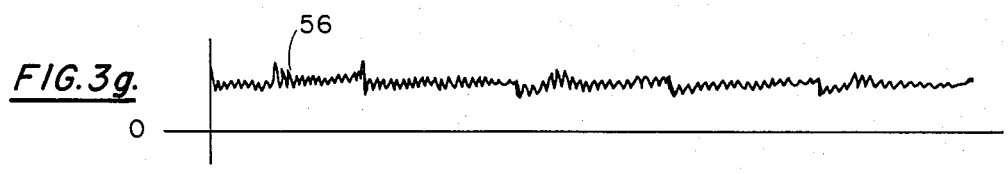
Figure 3H:
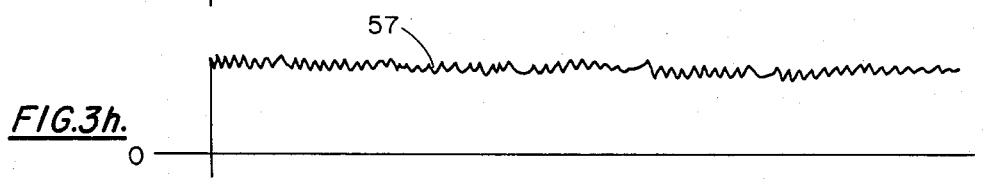
Figure 3J:
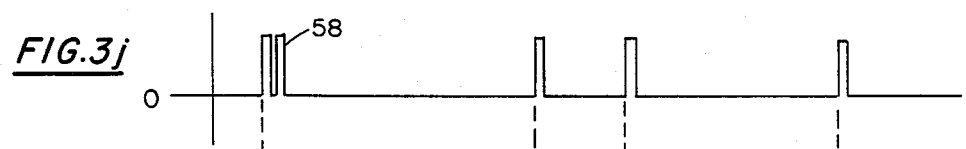
Figure 3K:
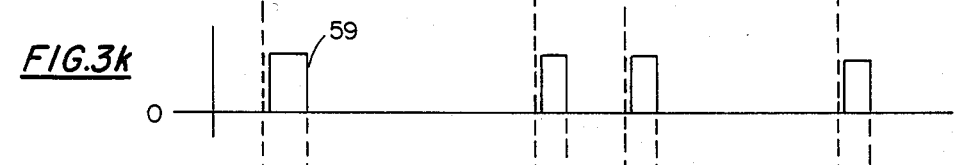

The wideband amplified signal is converted by synchronous demodulator 18 to waveform 53, FIG. 3d, while the narrowband amplified signal is synchronously converted by synchronous demodulator 20 to waveform 55, FIG. 3f. The signal displayed by waveform 55 is filtered as low-pass filter 21 which causes further attenuation to any interfering pulses. Waveform 56, FIG. 3g, represents the narrowband signal following low-pass filtering and waveform 57, FIG. 3h, represents this signal after it has been amplified through general amplifier 22 to establish its voltage level equivalent to that of waveform 53, FIG. 3d, (as output from synchronous demodulator 18). These two signals are inputted into comparator 19 where detection or identification of the occurrence of an interfering pulse is made and an alerting signal in the form of a digital pulse as long s the interfering pulse is triggered at the comparator output (waveform 58, FIG. 3j).

In this particular embodiment, the digital pulse is concurrently fed to OR gate 24 and one-shot multivibrator 23 which compensates for any phase delay of the interfering pulse caused as it passes through narrowband amplifier 16. The output of the one-shot multivibrator is also transmitted to a second input port in the OR gate where a control pulse is established which has a time duration sufficient to cover the inception of any interfering pulse and extending to end immediately following the full effect of the interfering pulse. This control pulse is emitted by the OR gate for input to hold circuit 25 for activating the hold circuit to interrupt the signal from narrowband video amplifier 16 only when an interfering pulse occurs and only for the duration of the interfering pulse while simultaneously holding the voltage level of the video signal constant over the pulse duration. Waveforms 58, FIG. 3j, 59, FIG. 3k, and 60, FIG. 3e, reflect this procedure of creating the control pulse of waveform 60.

Figure 3M:
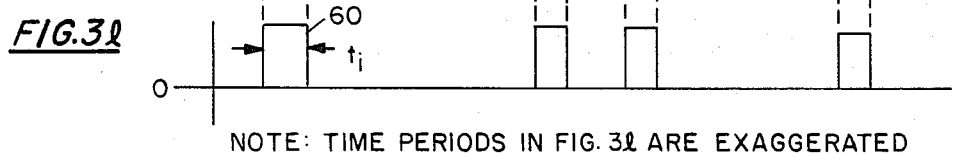
Figure 3M:
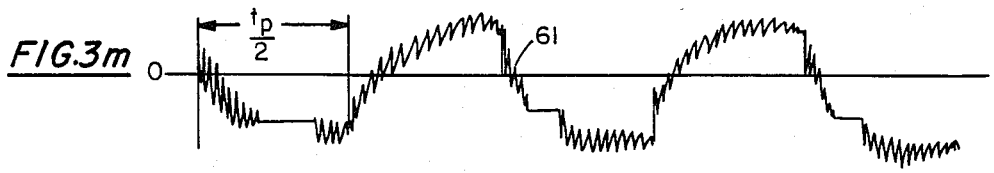

Waveform 61, FIG. 3m, displays the video signal after interfering pulses have been removed through hold circuit 25. The video signal then proceeds through the remainder of standard circuitry for radiometric receivers for final processing, analysis and/or display.

Figure 2:
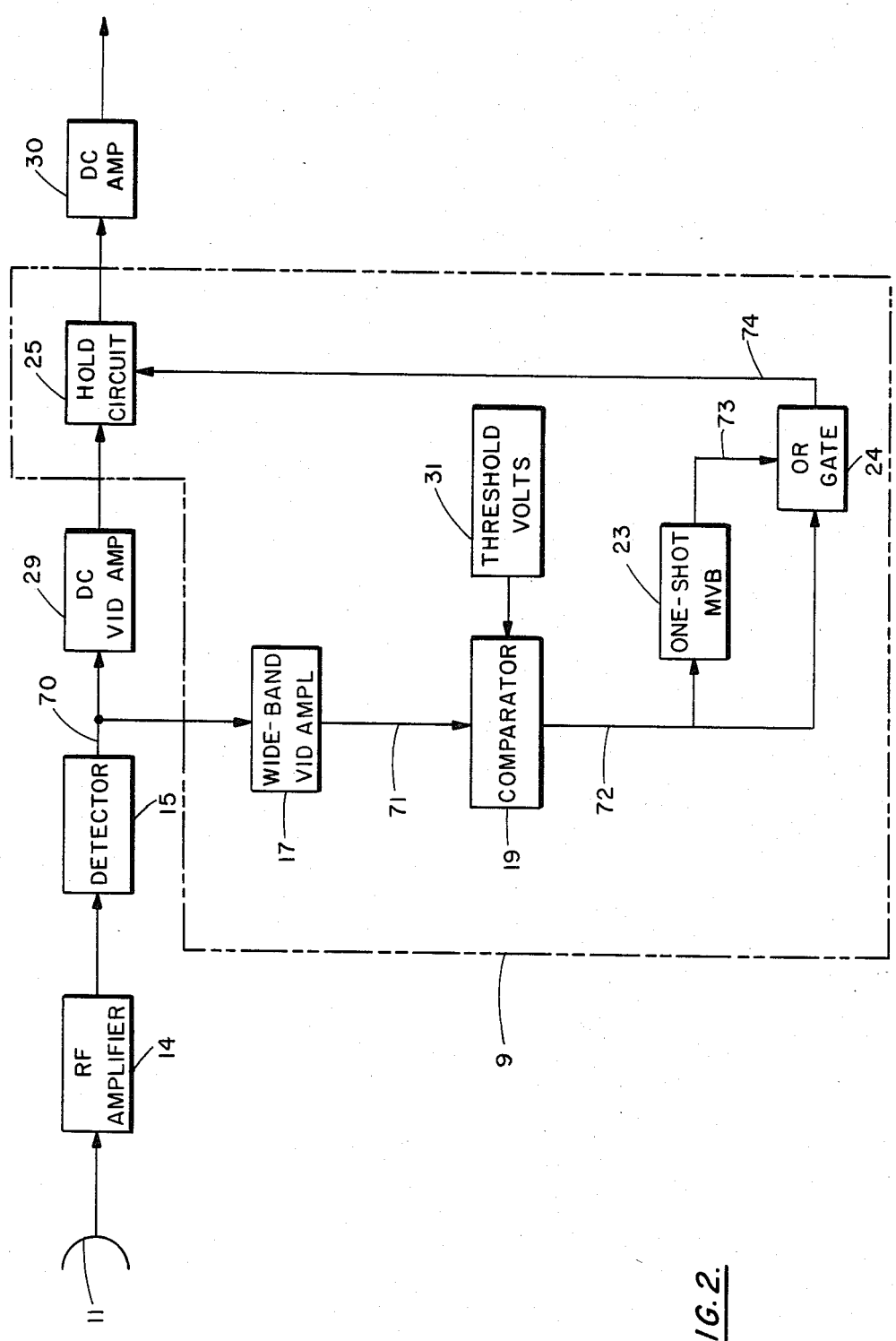
FIG. 2 is a block diagram of an alternate circuit of a portion of FIG. 1.

FIG. 2 is an alternative embodiment 9 of a portion of the present invention and a block diagram showing the invention applied for use with a total power radiometer circuit. The conventional circuit includes an antenna 11, RF amplifier 14, detector 15, DC video amplifier 29 and feed out to conventional circuitry for further processing, analysis and/or display. The circuitry added to eliminate any interfering noise pulses includes wideband video amplifier 17, comparator 19, threshold level generator 31, one-shot multivibrator 23, OR gate 24 and hold circuit 25.

More particularly, the low level radio frequency energy received by antenna 11 is amplified through RF amplifier 14 and converted to a video-frequency signal by detector 15. Waveform 70, FIG. 4a, represents a video signal containing interfering noise pulses at the output of the detector. This video signal is tapped by wideband video amplifier 17 which causes strong amplification of the interfering pulses as depicted in waveform 71, FIG. 4b. The threshold level generator 31 is adjusted at a voltage level above which it is desired to detect any interfering pulse voltage level in the wideband amplifier video signal (waveform 71). The comparator 19 accepts the two inputs from the wideband amplifier and the threshold level generator to make the comparison in order to detect when a pulse occurs above the threshold voltage level. Upon such occurrence, the comparator emits a digital alerting pulse to OR gate 24 and one-shot multivibrator 23 connected to a second input port in the OR gate. The combination of the one-shot multivibrator and the OR gate shape and create a control pulse which is initiated at the inception of and continues through the final effect of an interfering pulse, similarly as done in the embodiment of FIG. 1. This control pulse is transmitted to an input port of hold circuit 25 where the video signal is interrupted during the control pulse while simultaneously the voltage level of the video-frequency signal is held constant for the duration of the control pulse. Waveforms 72, FIG. 4c, and 73, FIG. 4d, represent the digital pulses input to the OR gate and waveform 74, FIG. 4e represents the control pulse output by the OR gate to the hold circuit.

Clearly, the one-shot multivibrator 23 in combination with the OR gate 24 in both embodiments of FIG. 1 and FIG. 2 can be replaced by a computer or other digital processing device to accomplish the same function.

Further, it is clear that although the embodiments described above have been concerned with radar and radio-frequency circuits or radiometers, the principles and methods used may be applied to any type of radiometer operating at any frequency.

Although this invention has been described with relation to specific embodiments, it will be apparent to those skilled in the art that other embodiments can be used without departing from the true scope of the invention.

Obviously, many other modifications and variations of the present invention are possible in the light of the above teachings. It is therefore to be understood that within the scope of the appended claims the invention may be practiced otherwise than as specifically described.

What is claimed is:

1. An apparatus for automatically removing interfering noise pulses from a modulated video-frequency signal in a Dicke type circuit comprising:

means coupled to receive the modulated video-frequency signal for wideband-amplifying it;

means connected to simultaneously receive the same modulated video-frequency signal received by the wideband-amplifying means for narrowband-amplifying it;

first means coupled to receive the wideband-amplifying means output for demodulating the amplified, modulated video-frequency signal in synchronization with its original modulation;

second means coupled to an output of the narrowband-amplifying means for demodulating the amplified, modulated video-frequency signal in synchronization with its original modulation;

means coupled to receive an output signal from the second demodulating means for low-pass filtering;

means coupled to the low-pass filtering means for general-amplifying its output signal to a voltage level approximately equivalent to an output signal of the first demodulating means;

means coupled to receive the output signal of the first demodulating means and the output signal of the general-amplifying means for comparing them so that an alerting signal is emitted when interfering noise pulses are present;

means coupled to receive the alerting signal for establishing a control pulse extending from the inception to the final effect of each interfering pulse; and means connected to the establishing means for interrupting each interfering noise pulse and simultaneously holding the modulated video-frequency signal's voltage constant during the period of the control pulse.

2. An apparatus according to claim 1 in which the establishing means includes a one-shot multivibrator and an OR gate receiving as inputs the output of the one-shot multivibrator and the alerting signal from the comparing means.

* * * * *